US007657807B1

(12) United States Patent
Watkins et al.

(10) Patent No.: US 7,657,807 B1
(45) Date of Patent: Feb. 2, 2010

(54) INTEGRATED CIRCUIT WITH EMBEDDED TEST FUNCTIONALITY

(75) Inventors: Daniel R. Watkins, Saratoga, CA (US); Hunter S. Donahue, Cupertino, CA (US); Thomas Alan Ziaja, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 528 days.

(21) Appl. No.: 11/167,248

(22) Filed: Jun. 27, 2005

(51) Int. Cl.
*G01R 31/28* (2006.01)

(52) U.S. Cl. .................. 714/727; 714/718; 714/724; 714/726

(58) Field of Classification Search .................. None
See application file for complete search history.

(56) References Cited

U.S. PATENT DOCUMENTS

| | | | | |
|---|---|---|---|---|
| 5,130,988 | A * | 7/1992 | Wilcox et al. ............... | 714/727 |
| 5,477,548 | A * | 12/1995 | Beenker et al. .............. | 714/727 |
| 5,673,276 | A * | 9/1997 | Jarwala et al. ............... | 714/727 |
| 6,070,252 | A * | 5/2000 | Xu et al. ........................ | 714/30 |
| 6,115,763 | A * | 9/2000 | Douskey et al. ............... | 710/72 |
| 6,311,302 | B1 | 10/2001 | Adusumilli et al. | |
| 6,385,749 | B1 | 5/2002 | Adusumilli et al. | |
| 6,587,981 | B1 * | 7/2003 | Muradali et al. ............. | 714/726 |
| 6,681,238 | B1 | 1/2004 | Brice, Jr. et al. | |
| 6,691,270 | B2 * | 2/2004 | Blasco et al. ................ | 714/729 |
| 6,728,916 | B2 * | 4/2004 | Chen et al. ................... | 714/733 |
| 6,804,725 | B1 * | 10/2004 | Whetsel ........................ | 710/5 |
| 6,981,083 | B2 | 12/2005 | Arimilli et al. | |
| 7,076,575 | B2 | 7/2006 | Baitinger et al. | |
| 7,117,389 | B2 * | 10/2006 | Luick ........................... | 714/11 |
| 7,155,370 | B2 * | 12/2006 | Nejedlo ....................... | 702/186 |
| 7,197,647 | B1 | 3/2007 | Van Essen et al. | |
| 7,213,171 | B2 | 5/2007 | Haroun et | |
| 7,240,267 | B2 * | 7/2007 | Jayabharathi ............... | 714/733 |
| 7,246,282 | B2 * | 7/2007 | Chau et al. ................... | 714/724 |
| 2003/0046625 | A1 * | 3/2003 | Menon et al. ................ | 714/727 |
| 2004/0111591 | A1 | 6/2004 | Arimilli et al. | |

(Continued)

OTHER PUBLICATIONS

Texas Instruments IEEE Std 1149.1 (JTAG) Testability Primer, 1997, 146 pages.

(Continued)

*Primary Examiner*—Kevin L Ellis
*Assistant Examiner*—Guerrier Merant
(74) *Attorney, Agent, or Firm*—Robert C Kowert; Meyertons, Hood, Kivlin, Kowert & Goetzel, P.C.

(57) ABSTRACT

An integrated circuit including embedded test functionality. An integrated circuit may include a plurality of processor cores each configured to execute instructions, and a test access port configured to interface circuits included within the integrated circuit with a test environment external to the integrated circuit for testing of the circuits. The test access port may include virtualization logic configured to allow a first set of instructions executing on the given processor core to control activity of the test access port for testing of the circuits. In one embodiment, the circuits may be accessible for testing via a plurality of scan chains, wherein the scan chains and the test access port are compliant with a version of Joint Test Access Group (JTAG) standard IEEE 1149, and wherein the test access port includes a Test Data In (TDI) pin, a Test Data Out (TDO) pin, and a Test Clock (TCK) pin.

22 Claims, 7 Drawing Sheets

U.S. PATENT DOCUMENTS

| | | | |
|---|---|---|---|
| 2004/0123168 A1* | 6/2004 | Joo et al. | 713/300 |
| 2004/0186688 A1* | 9/2004 | Nejedlo | 702/186 |
| 2004/0187056 A1* | 9/2004 | Whetsel | 714/724 |
| 2005/0022065 A1* | 1/2005 | Dixon et al. | 714/42 |
| 2005/0066079 A1* | 3/2005 | Luick | 710/36 |
| 2005/0076280 A1* | 4/2005 | Martinez | 714/733 |
| 2005/0108600 A1* | 5/2005 | Arguelles | 714/701 |
| 2005/0120269 A1* | 6/2005 | Larson et al. | 714/29 |
| 2005/0182788 A1 | 8/2005 | Arndt et al. | |
| 2005/0193293 A1* | 9/2005 | Shikata | 714/718 |
| 2005/0232159 A1* | 10/2005 | Joo et al. | 370/241 |
| 2005/0240850 A1* | 10/2005 | Ohwada et al. | 714/738 |
| 2005/0257087 A1* | 11/2005 | Goff | 714/30 |
| 2005/0283637 A1 | 12/2005 | Coldicott et al. | |
| 2006/0004942 A1 | 1/2006 | Hetherington et al. | |
| 2006/0107160 A1* | 5/2006 | Ricchetti et al. | 714/742 |
| 2006/0117235 A1* | 6/2006 | Jayabharathi | 714/733 |
| 2006/0156098 A1* | 7/2006 | Bawany et al. | 714/724 |
| 2006/0248426 A1 | 11/2006 | Miner et al. | |
| 2006/0259818 A1 | 11/2006 | Howell et al. | |
| 2007/0028244 A1 | 2/2007 | Landis et al. | |

OTHER PUBLICATIONS

Waayers, "An Improved Test Control Architecture and Test Control Expansion For Core-Based System Chips," Proceedings of the International Test Conference (ITC) 2003, 10 pages.

* cited by examiner

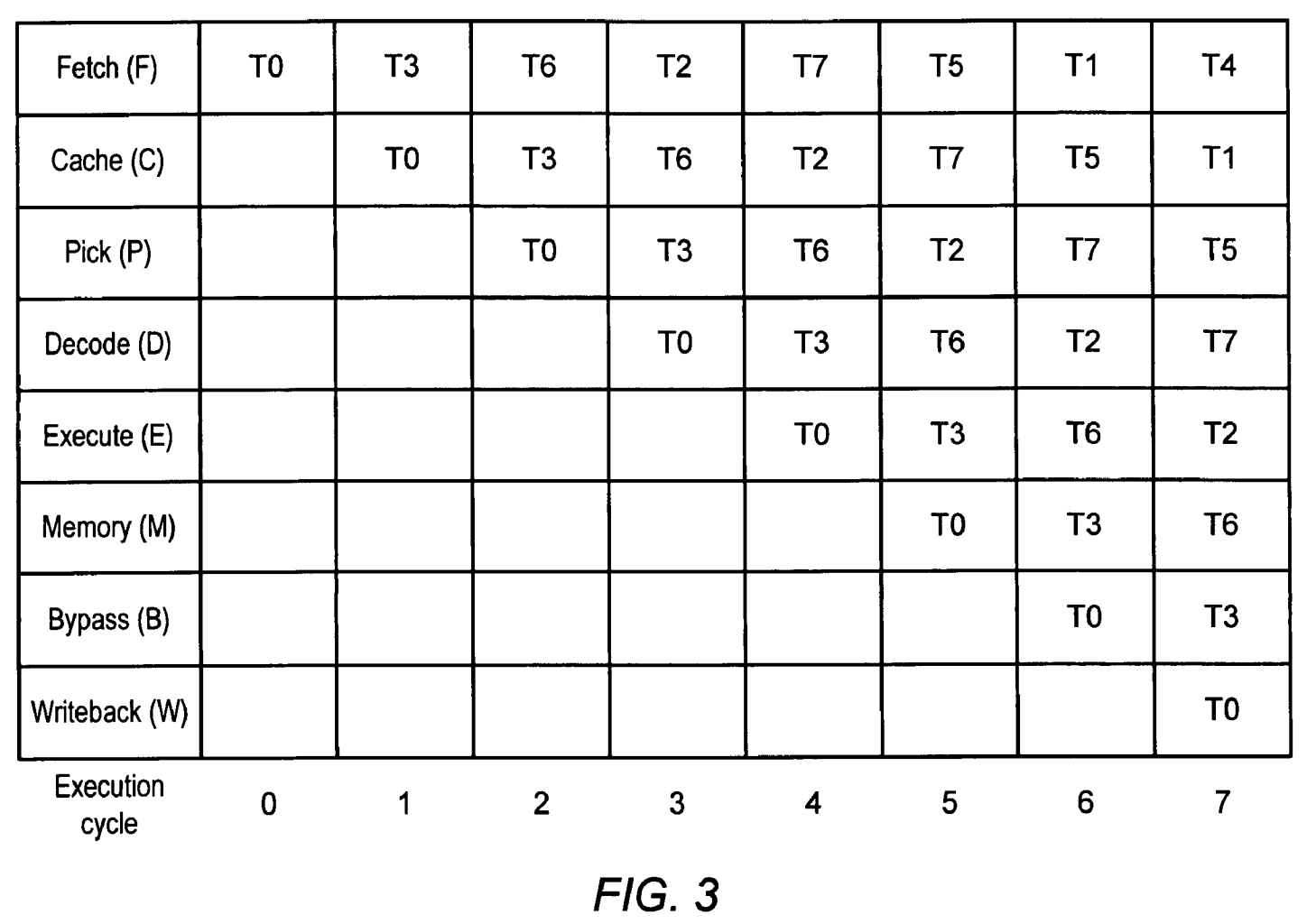

| | 0 | 1 | 2 | 3 | 4 | 5 | 6 | 7 |
|---|---|---|---|---|---|---|---|---|
| Fetch (F) | T0 | T3 | T6 | T2 | T7 | T5 | T1 | T4 |
| Cache (C) | | T0 | T3 | T6 | T2 | T7 | T5 | T1 |
| Pick (P) | | | T0 | T3 | T6 | T2 | T7 | T5 |
| Decode (D) | | | | T0 | T3 | T6 | T2 | T7 |
| Execute (E) | | | | | T0 | T3 | T6 | T2 |
| Memory (M) | | | | | | T0 | T3 | T6 |
| Bypass (B) | | | | | | | T0 | T3 |
| Writeback (W) | | | | | | | | T0 |
| Execution cycle | | | | | | | | |

FIG. 3

INTEGRATED CIRCUIT WITH EMBEDDED TEST FUNCTIONALITY

BACKGROUND OF THE INVENTION

1. Field of the Invention

This invention relates to integrated circuits, and more particularly, to techniques for implementing embedded test functionality within integrated circuits having multiple processor cores.

2. Description of the Related Art

Integrated circuits, which may include microprocessors and other digital logic devices as well as analog and mixed-signal devices, may generally include a significant number of semiconductor components manufactured through complex fabrication processes. As manufacturing geometries shrink, complex designs including hundreds of millions of interconnected transistor devices become feasible. However, advances in integrated circuit density and design and manufacturing complexity significantly increase the challenge of ensuring that the resulting device is functional, reliable and capable of operating within expected performance and environmental parameters.

For example, as microprocessor implementations become increasingly sophisticated, it may become more difficult to functionally verify the design, as increased functional complexity may lead to a greater number of possibilities for error in implementation. Likewise, as device geometries shrink, opportunities for manufacturing defects increase due to manufacturing environment impurities, process inconsistency, and other factors.

Integrated circuits are often tested during the manufacturing process through the use of a test environment including sophisticated and expensive automated test equipment. However, reliance on such test equipment may represent a significant time and economic cost in the manufacture of complex integrated circuits. For example, test equipment is often a limited resource within a test environment. If increased integrated circuit complexity requires an increased number of tests or duration of testing for a given circuit, overall manufacturing throughput may be correspondingly decreased, which may raise manufacturing costs. Alternatively, if the number of tests to be run is constrained to reduce overall testing time, product reliability may be impaired (e.g., if a defective product fails to be detected as such). Further, test equipment is generally an expensive resource whose cost scales with the complexity of the testing being performed. An integrated circuit with a large number of high-speed interface pins, for example, may thus require more expensive test equipment to adequately test the design, which may in turn increase manufacturing costs.

SUMMARY

An integrated circuit including support for embedded test functionality is disclosed. In one embodiment, an integrated circuit may include a plurality of processor cores each configured to execute instructions, and a test access port configured to interface circuits included within the integrated circuit with a test environment external to the integrated circuit for testing of the circuits. The test access port may include virtualization logic configured to allow a first set of instructions executing on the given processor core to control activity of the test access port for testing of the circuits.

In one specific implementation of the integrated circuit, the circuits may be accessible for testing via a plurality of scan chains, wherein the scan chains and the test access port are compliant with a version of Joint Test Access Group (JTAG) standard IEEE 1149, and wherein the test access port includes a Test Data In (TDI) pin, a Test Data Out (TDO) pin, and a Test Clock (TCK) pin.

In another specific implementation of the integrated circuit, the virtualization logic may include one or more control registers configured to control the TDI, TDO and TCK pins of the test access port in response to being programmed by instructions executing on the given processor core.

A method of testing an integrated circuit including a plurality of processor cores each independently programmable to execute instructions is further contemplated. In one embodiment, the method may include testing the integrated circuit via a test environment external to the integrated circuit to determine whether the integrated circuit includes sufficient functional resources to execute embedded testing instructions. In response to determining that the integrated circuit includes sufficient functional resources, the method may include loading embedded testing instructions into the integrated circuit from the external test environment for execution by a given one of the processor cores, and the given processor core executing the embedded testing instructions independently of the external test environment.

BRIEF DESCRIPTION OF THE DRAWINGS

Other aspects of the invention will become apparent upon reading the following detailed description and upon reference to the accompanying drawings in which:

FIG. 3 is a pipeline diagram illustrating the flow of instructions through one embodiment of a processor core.

Figure 1:
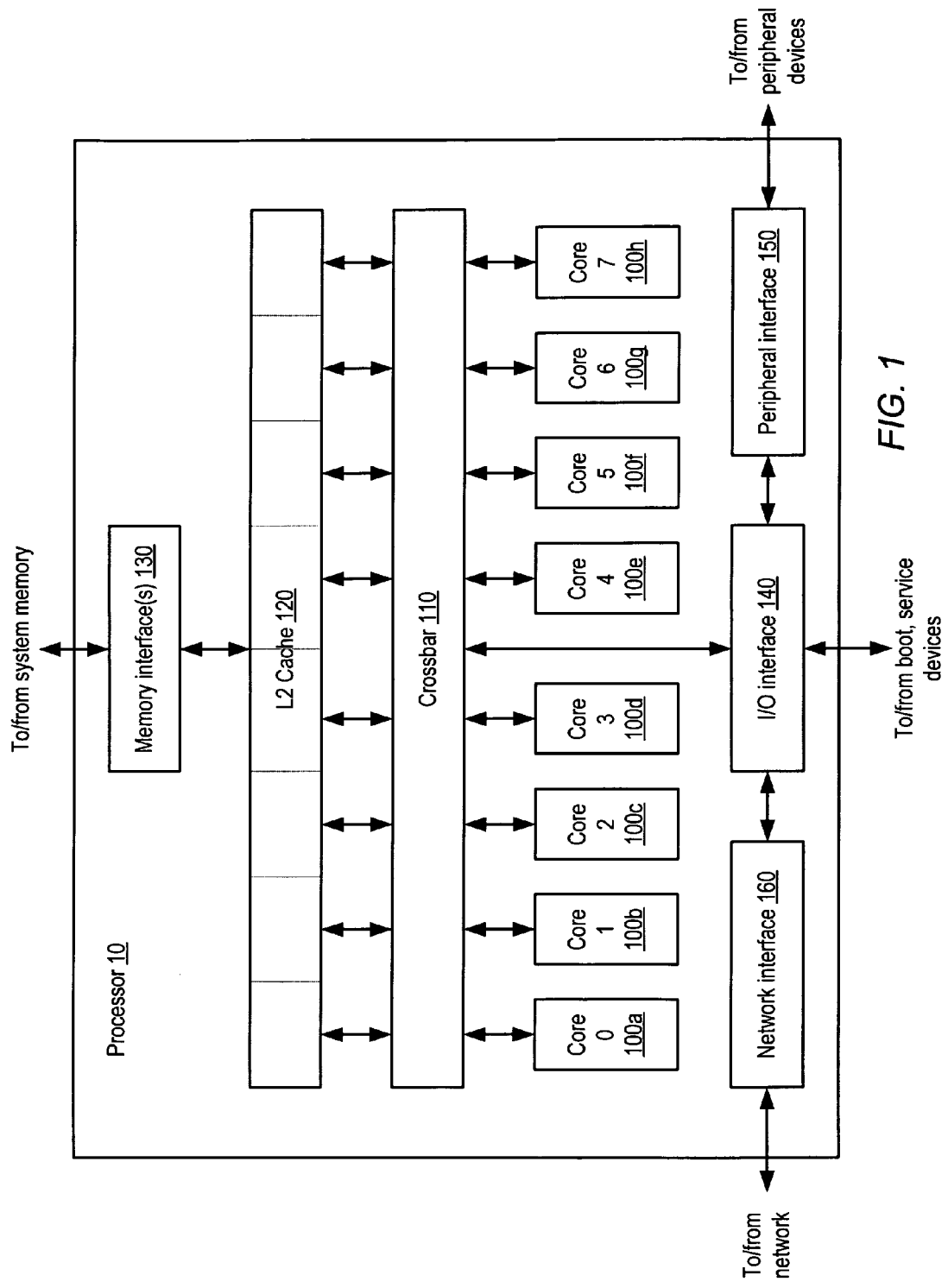
FIG. 1 is a block diagram illustrating one embodiment of a multithreaded processor.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF EMBODIMENTS

Overview of Multithreaded Processor Architecture

A block diagram illustrating one embodiment of a multithreaded processor 10 is shown in FIG. 1. In the illustrated embodiment, processor 10 includes a plurality of processor cores 100a-h, which are also designated "core 0" though "core 7". Each of cores 100 is coupled to an L2 cache 120 via a crossbar 110. L2 cache 120 is coupled to one or more memory interface(s) 130, which are coupled in turn to one or more banks of system memory (not shown). Additionally, crossbar 110 couples cores 100 to input/output (I/O) interface 140, which is in turn coupled to a peripheral interface 150 and a network interface 160. As described in greater detail below, I/O interface 140, peripheral interface 150 and network interface 160 may respectively couple processor 10 to boot and/or service devices, peripheral devices, and a network. In some embodiments, the elements included in processor 10 may be fabricated as part of a single integrated circuit (IC), for example on a single semiconductor die.

Cores 100 may be configured to execute instructions and to process data according to a particular instruction set architecture (ISA). In one embodiment, cores 100 may be configured to implement the SPARC® V9 ISA, although in other embodiments it is contemplated that any desired ISA may be employed, such as x86, PowerPC® or MIPS®, for example. In the illustrated embodiment, each of cores 100 may be configured to operate independently of the others, such that all cores 100 may execute in parallel. Additionally, as described below in conjunction with the descriptions of FIG. 2 and FIG. 3, in some embodiments each of cores 100 may be configured to execute multiple threads concurrently, where a given thread may include a set of instructions that may execute independently of instructions from another thread. (For example, an individual software process, such as an application, may consist of one or more threads that may be scheduled for execution by an operating system.) Such a core 100 may also be referred to as a multithreaded (MT) core. In one embodiment, each of cores 100 may be configured to concurrently execute instructions from eight threads, for a total of 64 threads concurrently executing across processor 10. However, in other embodiments it is contemplated that other numbers of cores 100 may be provided, and that cores 100 may concurrently process different numbers of threads.

Crossbar 110 may be configured to manage data flow between cores 100 and the shared L2 cache 120. In one embodiment, crossbar 110 may include logic (such as multiplexers or a switch fabric, for example) that allows any core 100 to access any bank of L2 cache 120, and that conversely allows data to be returned from any L2 bank to any core 100. Crossbar 110 may be configured to concurrently process data requests from cores 100 to L2 cache 120 as well as data responses from L2 cache 120 to cores 100. In some embodiments, crossbar 110 may include logic to queue data requests and/or responses, such that requests and responses may not block other activity while waiting for service. Additionally, in one embodiment crossbar 110 may be configured to arbitrate conflicts that may occur when multiple cores 100 attempt to access a single bank of L2 cache 120.

L2 cache 120 may be configured to cache instructions and data for use by cores 100. In the illustrated embodiment, L2 cache 120 may be organized into eight separately addressable banks that may each be independently accessed, such that in the absence of conflicts, each bank may concurrently return data to a respective core 100. In some embodiments, each individual bank may be implemented using set-associative or direct-mapped techniques. For example, in one embodiment, L2 cache 120 may be a 4 megabyte (MB) cache, where each 512 kilobyte (KB) bank is 16-way set associative with a 64-byte line size, although other cache sizes and geometries are possible and contemplated. L2 cache 120 may be implemented in some embodiments as a writeback cache in which written (dirty) data may not be written to system memory until a corresponding cache line is evicted.

In some embodiments, L2 cache 120 may implement queues for requests arriving from and results to be sent to crossbar 110. Additionally, in some embodiments L2 cache 120 may implement a fill buffer configured to store fill data arriving from memory interface 130, a writeback buffer configured to store dirty evicted data to be written to memory, and/or a miss buffer configured to store L2 cache accesses that cannot be processed as simple cache hits (e.g., L2 cache misses, cache accesses matching older misses, accesses such as atomic operations that may require multiple cache accesses, etc.). L2 cache 120 may variously be implemented as single-ported or multiported (i.e., capable of processing multiple concurrent read and/or write accesses). In either case, L2 cache 120 may implement arbitration logic to prioritize cache access among various cache read and write requesters.

Memory interface 130 may be configured to manage the transfer of data between L2 cache 120 and system memory, for example in response to L2 fill requests and data evictions. In some embodiments, multiple instances of memory interface 130 may be implemented, with each instance configured to control a respective bank of system memory. Memory interface 130 may be configured to interface to any suitable type of system memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. In some embodiments, memory interface 130 may be configured to support interfacing to multiple different types of system memory.

In the illustrated embodiment, processor 10 may also be configured to receive data from sources other than system memory. I/O interface 140 may be configured to provide a central interface for such sources to exchange data with cores 100 and/or L2 cache 120 via crossbar 110. In some embodiments, I/O interface 140 may be configured to coordinate Direct Memory Access (DMA) transfers of data between network interface 160 or peripheral interface 150 and system memory via memory interface 130. In addition to coordinating access between crossbar 110 and other interface logic, in one embodiment I/O interface 140 may be configured to couple processor 10 to external boot and/or service devices. For example, initialization and startup of processor 10 may be controlled by an external device (such as, e.g., a Field Programmable Gate Array (FPGA)) that may be configured to provide an implementation- or system-specific sequence of boot instructions and data. Such a boot sequence may, for example, coordinate reset testing, initialization of peripheral devices and initial execution of processor 1, before the boot process proceeds to load data from a disk or network device. Additionally, in some embodiments such an external device may be configured to place processor 10 in a debug, diagnostic, or other type of service mode upon request.

Peripheral interface 150 may be configured to coordinate data transfer between processor 10 and one or more peripheral devices. Such peripheral devices may include, without limitation, storage devices (e.g., magnetic or optical media-based storage devices including hard drives, tape drives, CD drives, DVD drives, etc.), display devices (e.g., graphics subsystems), multimedia devices (e.g., audio processing subsystems), or any other suitable type of peripheral device. In one embodiment, peripheral interface 150 may implement one or more instances of an interface such as Peripheral Component Interface Express (PCI Express™), although it is contemplated that any suitable interface standard or combination of standards may be employed. For example, in some embodiments peripheral interface 150 may be configured to implement a version of Universal Serial Bus (USB) protocol or IEEE 1394 (Firewire®) protocol in addition to or instead of PCI Express™.

Network interface 160 may be configured to coordinate data transfer between processor 10 and one or more devices (e.g., other computer systems) coupled to processor 10 via a network. In one embodiment, network interface 160 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, network interface 160 may be configured to implement multiple discrete network interface ports.

Overview of Fine-Grained Multithreading Processor Core

As mentioned above, in one embodiment each of cores 100 may be configured for multithreaded execution. More specifically, in one embodiment each of cores 100 may be configured to perform fine-grained multithreading, in which each core may select instructions to execute from among a pool of instructions corresponding to multiple threads, such that instructions from different threads may be scheduled to execute adjacently. For example, in a pipelined embodiment of core 100 employing fine-grained multithreading, instructions from different threads may occupy adjacent pipeline stages, such that instructions from several threads may be in various stages of execution during a given core processing cycle.

Figure 2:
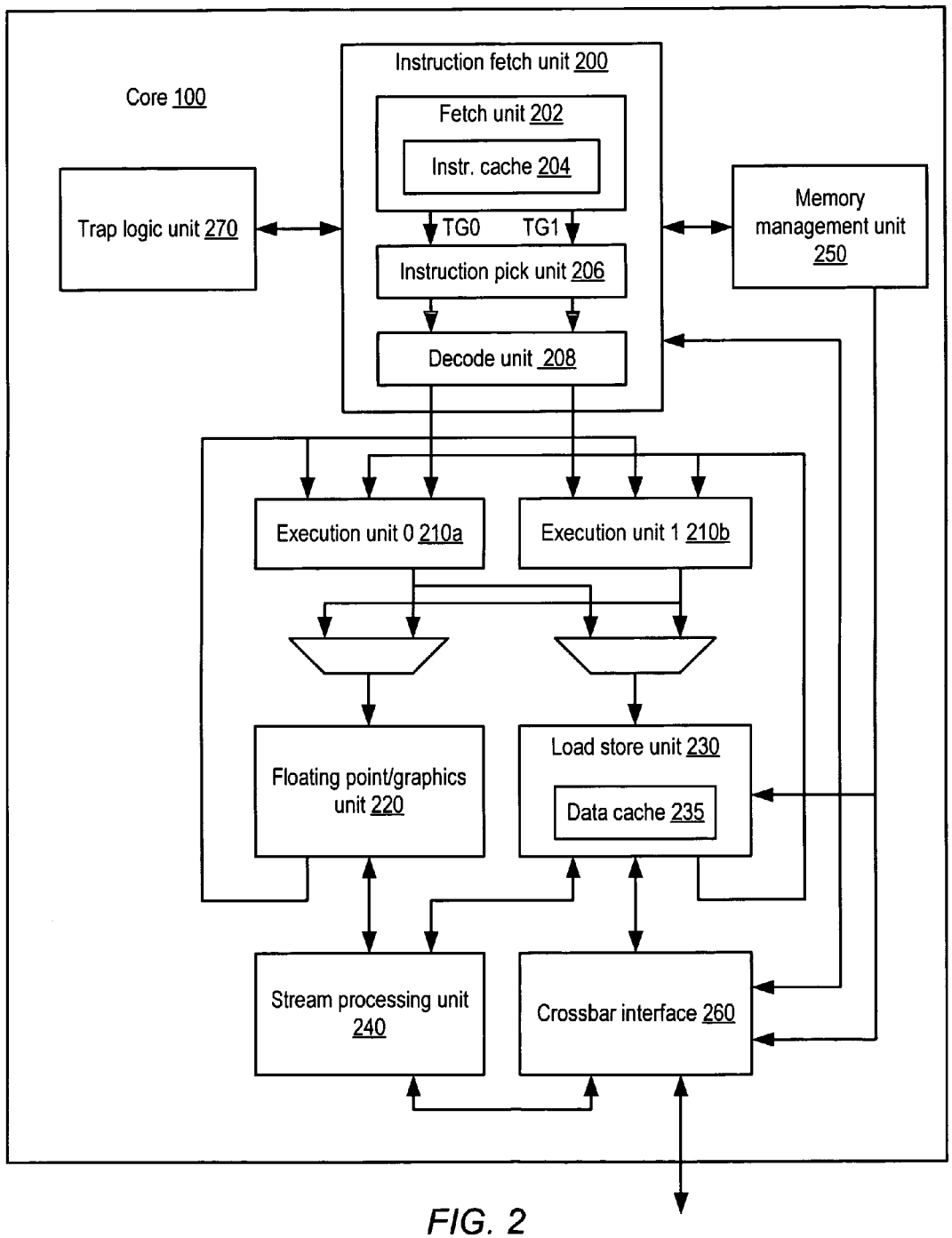
FIG. 2 is a block diagram illustrating one embodiment of a processor core.

One embodiment of core 100 configured to perform fine-grained multithreading is illustrated in FIG. 2. In the illustrated embodiment, core 100 includes an instruction fetch unit (IFU) 200 coupled to a memory management unit (MMU) 250, a crossbar interface 260, a trap logic unit (TLU) 270, and a plurality of execution units (EXU0, EXU1) 210a-b. (Execution units 210a-b may also be referred to generically as EXUs 210.) Each of execution units 210a-b is coupled to both a floating point/graphics unit (FGU) 220 and a load store unit (LSU) 230. Each of the latter units is also coupled to send data back to each of execution units 210a-b. Both FGU 220 and LSU 230 are coupled to a stream processing unit (SPU) 240. Additionally, LSU 230, SPU 240 and MMU 250 are coupled to crossbar interface 260, which is in turn coupled to crossbar 110 shown in FIG. 1.

Instruction fetch unit 200 may be configured to provide instructions to the rest of core 100 for execution. In the illustrated embodiment, IFU 200 includes a fetch unit 202, an instruction pick unit 206, and a decode unit 208. Fetch unit 202 further includes an instruction cache 204. In one embodiment, fetch unit 202 may include logic to maintain fetch addresses (e.g., derived from program counters) corresponding to each thread being executed by core 100, and to coordinate the retrieval of instructions from instruction cache 204 according to those fetch addresses. In some embodiments, instruction cache 204 may include fewer access ports than the number of threads executable on core 100, in which case fetch unit 202 may implement arbitration logic configured to select one or more threads for instruction fetch during a given execution cycle. For example, fetch unit 202 may implement a least-recently-fetched algorithm to select a thread to fetch. Fetch unit 202 may also implement logic to handle instruction cache misses and translation of virtual instruction fetch addresses to physical addresses (e.g., fetch unit 202 may include an Instruction Translation Lookaside Buffer (ITLB)). Additionally, in some embodiments fetch unit 202 may include logic to predict branch outcomes and/or fetch target addresses, such as a Branch History Table (BHT), Branch Target Buffer (BTB), or other suitable structure, for example.

In one embodiment, fetch unit 202 may be configured to maintain a pool of fetched, ready-for-issue instructions drawn from among each of the threads being executed by core 100. For example, fetch unit 202 may implement a respective instruction buffer corresponding to each thread in which several recently-fetched instructions from the corresponding thread may be stored. In one embodiment, instruction pick unit 206 may be configured to select one or more instructions to be decoded and issued to execution units 210. In the illustrated embodiment, the threads fetched by fetch unit 202 may be divided into two thread groups denoted TG0 and TG1 (for example, if core 100 implements eight threads, each of TG0 and TG1 may include four threads).

Pick unit 206, in the illustrated embodiment, may be configured to attempt to select one instruction to schedule for execution from each of TG0 and TG1, such that two instructions may be selected for execution during a given execution cycle. For example, pick unit 206 may employ a least-recently-picked (LRP) algorithm in which the least recently picked thread within a given thread group that is ready for execution is selected. It is noted that in one embodiment, thread fetching as performed by fetch unit 202 and instruction selection as performed by pick unit 206 may be largely independent of one another. In some embodiments, pick unit 206 may schedule instructions before all factors affecting instruction scheduling are known (e.g., instruction dependencies, implementation-specific resource hazards, etc.), in which case a picked instruction may be canceled at a later execution stage. In other embodiments, it is contemplated that other instruction selection algorithms may be employed, including algorithms that take additional instruction scheduling factors into account. Further, it is contemplated that in some embodiments, pick unit 206 may be configured to select more than two instructions for execution in a given execution cycle, or may select instructions from all threads rather than specific groups of threads. Additionally, in one embodiment pick unit 206 may be configured to identify source operand dependencies that a given picked instruction may have on a previously issued instruction, and may configure other logic to appropriately select source operands (e.g., from a register file, or from a previous execution cycle via bypass logic).

Decode unit 208 may be configured to further prepare instructions selected by pick unit 206 for execution. In the illustrated embodiment, decode unit 208 may be configured to identify the specific type of a given instruction, such as whether the instruction is an integer, floating point, load/store, or other type of instruction, as well as to identify operands required by the given instruction. Additionally, in one embodiment decode unit 208 may be configured to detect and respond to scheduling hazards not detected during operation of pick unit 206. For example, in the illustrated embodiment, only one load store unit 230 is provided. Consequently, if two load/store-type instructions were picked for execution, decode unit 208 may be configured to cancel or stall one of those instructions and allow the other to be issued. In such an embodiment, decode unit 208 may employ an arbitration algorithm to determine which instruction to issue without favoring a particular thread or thread group. Numerous other types of scheduling and resource hazards detectable by decode unit 208 are possible and contemplated.

In some embodiments, instructions from a given thread may be speculatively issued from decode unit 208 for execution. For example, a given instruction from a certain thread may fall in the shadow of a conditional branch instruction from that same thread that was predicted to be taken or not-taken, or a load instruction from that same thread that was predicted to hit in data cache 235, but for which the actual outcome has not yet been determined. In such embodiments, after receiving notice of a misspeculation such as a branch misprediction or a load miss, IFU 200 may be configured to cancel misspeculated instructions from a given thread as well as issued instructions from the given thread that are dependent on or subsequent to the misspeculated instruction, and to redirect instruction fetch appropriately.

Execution units 210a-b may be configured to execute and provide results for certain types of instructions issued from IFU 200. In one embodiment, each of EXUs 210 may be similarly or identically configured to execute certain integer-type instructions defined in the implemented ISA, such as arithmetic, logical, and shift instructions. In the illustrated embodiment, EXU0 210a may be configured to execute integer instructions issued from TG0, while EXU1 210b may be configured to execute integer instructions issued from TG1. Further, each of EXUs 210 may include an integer register file configured to store register state information for all threads in its respective thread group. For example, if core 100 implements eight threads 0-7 where threads 0-3 are bound to TG0 and threads 4-7 are bound to TG1, EXU0 210a may store integer register state for each of threads 0-3 while EXU1 210b may store integer register state for each of threads 4-7. It is contemplated that in some embodiments, core 100 may include more or fewer than two EXUs 210, and EXUs 210 may or may not be symmetric in functionality. Also, in some embodiments EXUs 210 may not be bound to specific thread groups or may be differently bound than just described. Finally, in the illustrated embodiment instructions destined for FGU 220 or LSU 230 pass through one of EXUs 210. However, in alternative embodiments it is contemplated that such instructions may be issued directly from IFU 200 to their respective units without passing through one of EXUs 210.

Floating point/graphics unit 220 may be configured to execute and provide results for certain floating-point and graphics-oriented instructions defined in the implemented ISA. For example, in one embodiment FGU 220 may implement single- and double-precision floating-point arithmetic instructions compliant with a version of the Institute of Electrical and Electronics Engineers (IEEE) 754 Standard for Binary Floating-Point Arithmetic (more simply referred to as the IEEE 754 standard), such as add, subtract, multiply, divide, and certain transcendental functions. Also, in one embodiment FGU 220 may implement partitioned-arithmetic and graphics-oriented instructions defined by a version of the SPARC® Visual Instruction Set (VIS™) architecture, such as VIS™ 2.0. Additionally, in one embodiment FGU 220 may implement certain integer instructions such as integer multiply, divide, and population count instructions, and may be configured to perform multiplication operations on behalf of stream processing unit 240. Depending on the implementation of FGU 220, some instructions (e.g., some transcendental or extended-precision instructions) or instruction operand or result scenarios (e.g., certain denormal operands or expected results) may be trapped and handled or emulated by software.

In the illustrated embodiment, FGU 220 may be configured to store floating-point register state information for each thread in a floating-point register file. In one embodiment, FGU 220 may implement separate execution pipelines for floating point add/multiply, divide/square root, and graphics operations, while in other embodiments the instructions implemented by FGU 220 may be differently partitioned. In various embodiments, instructions implemented by FGU 220 may be fully pipelined (i.e., FGU 220 may be capable of starting one new instruction per execution cycle), partially pipelined, or may block issue until complete, depending on the instruction type. For example, in one embodiment floating-point add operations may be fully pipelined, while floating-point divide operations may block other divide/square root operations until completed.

Load store unit 230 may be configured to process data memory references, such as integer and floating-point load and store instructions as well as memory requests that may originate from stream processing unit 240. In some embodiments, LSU 230 may also be configured to assist in the processing of instruction cache 204 misses originating from IFU 200. LSU 230 may include a data cache 235 as well as logic configured to detect cache misses and to responsively request data from L2 cache 120 via crossbar interface 260. In one embodiment, data cache 235 may be configured as a write-through cache in which all stores are written to L2 cache 120 regardless of whether they hit in data cache 235; in some such embodiments, stores that miss in data cache 235 may cause an entry corresponding to the store data to be allocated within the cache. In other embodiments, data cache 235 may be implemented as a write-back cache.

In one embodiment, LSU 230 may include a miss queue configured to store records of pending memory accesses that have missed in data cache 235 such that additional memory accesses targeting memory addresses for which a miss is pending may not generate additional L2 cache request traffic. In the illustrated embodiment, address generation for a load/store instruction may be performed by one of EXUs 210. Depending on the addressing mode specified by the instruction, one of EXUs 210 may perform arithmetic (such as adding an index value to a base value, for example) to yield the desired address. Additionally, in some embodiments LSU 230 may include logic configured to translate virtual data addresses generated by EXUs 210 to physical addresses, such as a Data Translation Lookaside Buffer (DTLB).

Stream processing unit 240 may be configured to implement one or more specific data processing algorithms in hardware. For example, SPU 240 may include logic configured to support encryption/decryption algorithms such as Advanced Encryption Standard (AES), Data Encryption Standard/Triple Data Encryption Standard (DES/3DES), or Ron's Code #4 (RC4). SPU 240 may also include logic to implement hash or checksum algorithms such as Secure Hash Algorithm (SHA-1, SHA-256), Message Digest 5 (MD5), or Cyclic Redundancy Checksum (CRC). SPU 240 may also be configured to implement modular arithmetic such as modular multiplication, reduction and exponentiation. In one embodiment, SPU 240 may be configured to utilize the multiply array included in FGU 220 for modular multiplication. In various embodiments, SPU 240 may implement several of the aforementioned algorithms as well as other algorithms not specifically described.

SPU 240 may be configured to execute as a coprocessor independent of integer or floating-point instruction issue or execution. For example, in one embodiment SPU 240 may be configured to receive operations and operands via control registers accessible via software; in the illustrated embodiment SPU 240 may access such control registers via LSU 230. In such embodiments, SPU 240 may be indirectly programmed or configured by instructions issued from IFU 200, such as instructions to read or write control registers. However, even if indirectly programmed by such instructions, SPU 240 may execute independently without further interlock or coordination with IFU 200. In another embodiment SPU 240 may receive operations (e.g., instructions) and operands decoded and issued from the instruction stream by IFU 200, and may execute in response to such operations. That is, in such an embodiment SPU 240 may be configured as an additional functional unit schedulable from the instruction stream, rather than as an independent coprocessor.

In some embodiments, SPU 240 may be configured to freely schedule operations across its various algorithmic subunits independent of other functional unit activity. Additionally, SPU 240 may be configured to generate memory load and store activity, for example to system memory 810 described below. In the illustrated embodiment, SPU 240 may interact directly with crossbar interface 260 for such memory activity, while in other embodiments SPU 240 may coordinate memory activity through LSU 230. In one embodiment, software may poll SPU 240 through one or more control registers to determine result status and to retrieve ready results, for example by accessing additional control registers. In other embodiments, FGU 220, LSU 230 or other logic may be configured to poll SPU 240 at intervals to determine whether it has results that are ready to write back. In still other embodiments, SPU 240 may be configured to generate a trap when a result is ready, to allow software to coordinate result retrieval and processing.

As previously described, instruction and data memory accesses may involve translating virtual addresses to physical addresses. In one embodiment, such translation may occur on a page level of granularity, where a certain number of address bits comprise an offset into a given page of addresses, and the remaining address bits comprise a page number. For example, in an embodiment employing 4 MB pages, a 64-bit virtual address and a 40-bit physical address, 22 address bits (corresponding to 4 MB of address space, and typically the least significant address bits) may constitute the page offset. The remaining 42 bits of the virtual address may correspond to the virtual page number of that address, and the remaining 18 bits of the physical address may correspond to the physical page number of that address. In such an embodiment, virtual to physical address translation may occur by mapping a virtual page number to a particular physical page number, leaving the page offset unmodified.

Such translation mappings may be stored in an ITLB or a DTLB for rapid translation of virtual addresses during lookup of instruction cache 204 or data cache 235. In the event no translation for a given virtual page number is found in the appropriate TLB, memory management unit 250 may be configured to provide a translation. In one embodiment, MMU 250 may be configured to manage one or more translation tables stored in system memory and to traverse such tables (which in some embodiments may be hierarchically organized) in response to a request for an address translation, such as from an ITLB or DTLB miss. (Such a traversal may also be referred to as a page table walk.) In some embodiments, if MMU 250 is unable to derive a valid address translation, for example if one of the memory pages including a necessary page table is not resident in physical memory (i.e., a page miss), MMU 250 may be configured to generate a trap to allow a memory management software routine to handle the translation. It is contemplated that in various embodiments, any desirable page size may be employed. Further, in some embodiments multiple page sizes may be concurrently supported.

A number of functional units in the illustrated embodiment of core 100 may be configured to generate off-core memory or I/O requests. For example, IFU 200 or LSU 230 may generate access requests to L2 cache 120 in response to their respective cache misses. SPU 240 may be configured to generate its own load and store requests independent of LSU 230, and MMU 250 may be configured to generate memory requests while executing a page table walk. Other types of off-core access requests are possible and contemplated. In the illustrated embodiment, crossbar interface 260 may be configured to provide a centralized interface to the port of crossbar 110 associated with a particular core 100, on behalf of the various functional units that may generate accesses that traverse crossbar 110. In one embodiment, crossbar interface 260 may be configured to maintain queues of pending crossbar requests and to arbitrate among pending requests to determine which request or requests may be conveyed to crossbar 110 during a given execution cycle. For example, crossbar interface 260 may implement a least-recently-used or other algorithm to arbitrate among crossbar requesters. In one embodiment, crossbar interface 260 may also be configured to receive data returned via crossbar 110, such as from L2 cache 120 or I/O interface 140, and to direct such data to the appropriate functional unit (e.g., data cache 235 for a data cache fill due to miss). In other embodiments, data returning from crossbar 110 may be processed externally to crossbar interface 260.

During the course of operation of some embodiments of core 100, exceptional events may occur. For example, an instruction from a given thread that is picked for execution by pick unit 206 may be not be a valid instruction for the ISA implemented by core 100 (e.g., the instruction may have an illegal opcode), a floating-point instruction may produce a result that requires further processing in software, MMU 250 may not be able to complete a page table walk due to a page miss, a hardware error (such as uncorrectable data corruption in a cache or register file) may be detected, or any of numerous other possible architecturally-defined or implementation-specific exceptional events may occur. In one embodiment, trap logic unit 270 may be configured to manage the handling of such events. For example, TLU 270 may be configured to receive notification of an exceptional event occurring during execution of a particular thread, and to cause execution control of that thread to vector to a supervisor-mode software handler (i.e., a trap handler) corresponding to the detected event. Such handlers may include, for example, an illegal opcode trap handler configured to return an error status indication to an application associated with the trapping thread and possibly terminate the application, a floating-point trap handler configured to fix up an inexact result, etc.

In one embodiment, TLU 270 may be configured to flush all instructions from the trapping thread from any stage of processing within core 100, without disrupting the execution of other, non-trapping threads. In some embodiments, when a specific instruction from a given thread causes a trap (as opposed to a trap-causing condition independent of instruction execution, such as a hardware interrupt request), TLU 270 may implement such traps as precise traps. That is, TLU 270 may ensure that all instructions from the given thread that occur before the trapping instruction (in program order) complete and update architectural state, while no instructions from the given thread that occur after the trapping instruction (in program order) complete or update architectural state.

Exemplary Core Pipeline Diagram

In the illustrated embodiment, core 100 may be configured for pipelined execution, in which processing of new instructions may begin before older instructions have completed, such that multiple instructions from various threads may be in various stages of processing during a given core execution cycle. A pipeline diagram illustrating the flow of integer instructions through one embodiment of core 100 is shown in FIG. 3. In the illustrated embodiment, execution of integer instructions is divided into eight stages, denoted Fetch (F), Cache (C), Pick (P), Decode (D), Execute (E), Memory (M), Bypass (B), and Writeback (W). In other embodiments, it is contemplated that different numbers of pipe stages corresponding to different types of functionality may be employed.

It is further contemplated that other pipelines of different structure and depth may be implemented for integer or other instructions. For example, floating-point instructions may execute in a longer pipeline than integer instructions.

The first four stages of the illustrated integer pipeline may generally correspond to the functioning of IFU 200. In one embodiment, during the Fetch stage, one or more threads to fetch may be selected, and instruction cache 204 may be accessed for the selected thread. During the Cache stage, fetch unit 202 may determine whether the access of the previous cycle hit or missed the cache. If the access hit, the instructions read from the cache may be stored in instruction buffers. During the Pick stage, pick unit 206 may be configured in one embodiment to select at most two instructions to issue, one for each thread group as described above. Source dependencies of the selected instructions on previously issued instructions may also be detected during the Pick stage. During the Decode stage, decode unit 208 may be configured to decode the selected instructions and to determine whether resource hazards exist as described above. For integer operations, data operands may also be selected during the Decode stage. For example, operands may be retrieved from an integer register file, or bypass logic may be configured to bypass operands from another pipe stage.

During the Execute stage, one or both of execution units 210 may be active to compute an instruction result. If an instruction in the integer execution pipeline is not a load or store instruction, in the illustrated embodiment it may be idle during the Memory and Bypass stages before its result is committed (i.e., written back to the integer register file) in the Writeback stage. A load or store instruction may have its address calculated by one of execution units 210 during the Execute stage. During the Memory stage of a load instruction, data cache 235 may be accessed, while during the Bypass stage, LSU 230 may determine whether a data cache hit or miss occurred. In the hit case, data may be forwarded to the appropriate execution unit 210 (e.g., dependent on the thread group of the load instruction) to be committed during the Writeback stage. In one embodiment, store instructions and load instructions that miss data cache 235 may execute with different pipeline timing than shown in FIG. 3.

In the illustrated embodiment, integer instructions are depicted as executing back-to-back in the pipeline without stalls. In execution cycles 0 through 7, instructions from threads 0, 3, 6, 2, 7, 5, 1 and 4 enter the Fetch stage, respectively, though in other embodiments, instructions may issue from various threads in a different order according to the operation of pick unit 206. In some instances, other instructions issued prior to execution cycle 0 may also be in the pipeline. Additionally, in some embodiments, two different instructions from the same or different threads may execute during the same pipeline stage. For example, in the illustrated embodiment of core 100, one integer instruction may be issued to each of execution units 210 in a single cycle.

By execution cycle 7, it is noted that each stage of the pipeline holds an instruction from a different thread in a different stage of execution, in contrast to conventional processor implementations that typically require a pipeline flush when switching between threads or processes. In some embodiments, flushes and stalls due to resource conflicts or other scheduling hazards may cause some pipeline stages to have no instruction during a given cycle. However, in the fine-grained multithreaded processor implementation employed by the illustrated embodiment of core 100, such flushes and stalls may be directed to a single thread in the pipeline, leaving other threads undisturbed. Additionally, even if one thread being processed by core 100 stalls for a significant length of time (for example, due to an L2 cache miss), instructions from another thread may be readily selected for issue, thus increasing overall thread processing throughput.

Embedded Testing of Processor Circuitry

As shown in FIGS. 1 and 2, processor 10 and cores 100 may include a substantial number of circuit elements. For example, in some embodiments processor 10 may include hundreds of millions of transistor devices interconnected as combinatorial logic gates, storage arrays, state elements such as registers or flip-flops and other types of circuits. Owing to the sheer number of devices that may be included within processor 10 and the complexity of the circuits that may include them, numerous opportunities exist for failures that may arise during the manufacturing or operation of processor 10. For example, manufacturing flaws may cause a device or interconnect to be permanently nonfunctional (e.g., circuit nodes may be permanently "stuck at" a logic 0 or 1 value due to open or short circuits), which may result in circuit malfunction and possibly a malfunction of a core 100 or processor 10. Additionally, variations in manufacturing processes as well as specific design characteristics may result in transient failures that arise from operating conditions of processor 10. For example, certain circuits within processor 10 may exhibit timing-sensitive behavior, such that they may malfunction if clocked at a rate that is too fast or too slow. Other circuits may exhibit sensitivity to operating conditions such as temperature, circuit voltage, noise, or other factors that may impact correct circuit operation.

In many conventional embodiments, an integrated circuit (IC) may include an interface configured to allow automated test equipment (ATE) external to the IC to access and manipulate circuit structures for testing purposes. For example, after manufacture, an IC may be coupled to a ATE tester that may be configured to run a series of tests to ascertain whether the IC is functional and/or to grade its performance (e.g., to categorize the IC into one of several frequency bins according to the maximum clock frequency at which the circuit reliably operates). However, many costs are often associated with the use of ATE devices in testing ICs. For example, the complexity and expense of ATE devices tends to scale with the number of IC pins and the operating frequency supported by the ATE device. The manufacturing throughput of ICs is often limited by the available ATE device resources, which may considerably limit the total amount of test time it is economically feasible to allocate to a given device. Conversely, a complex IC design that requires substantial test time for functional or performance validation may be correspondingly more expensive to manufacture.

Figure 4:
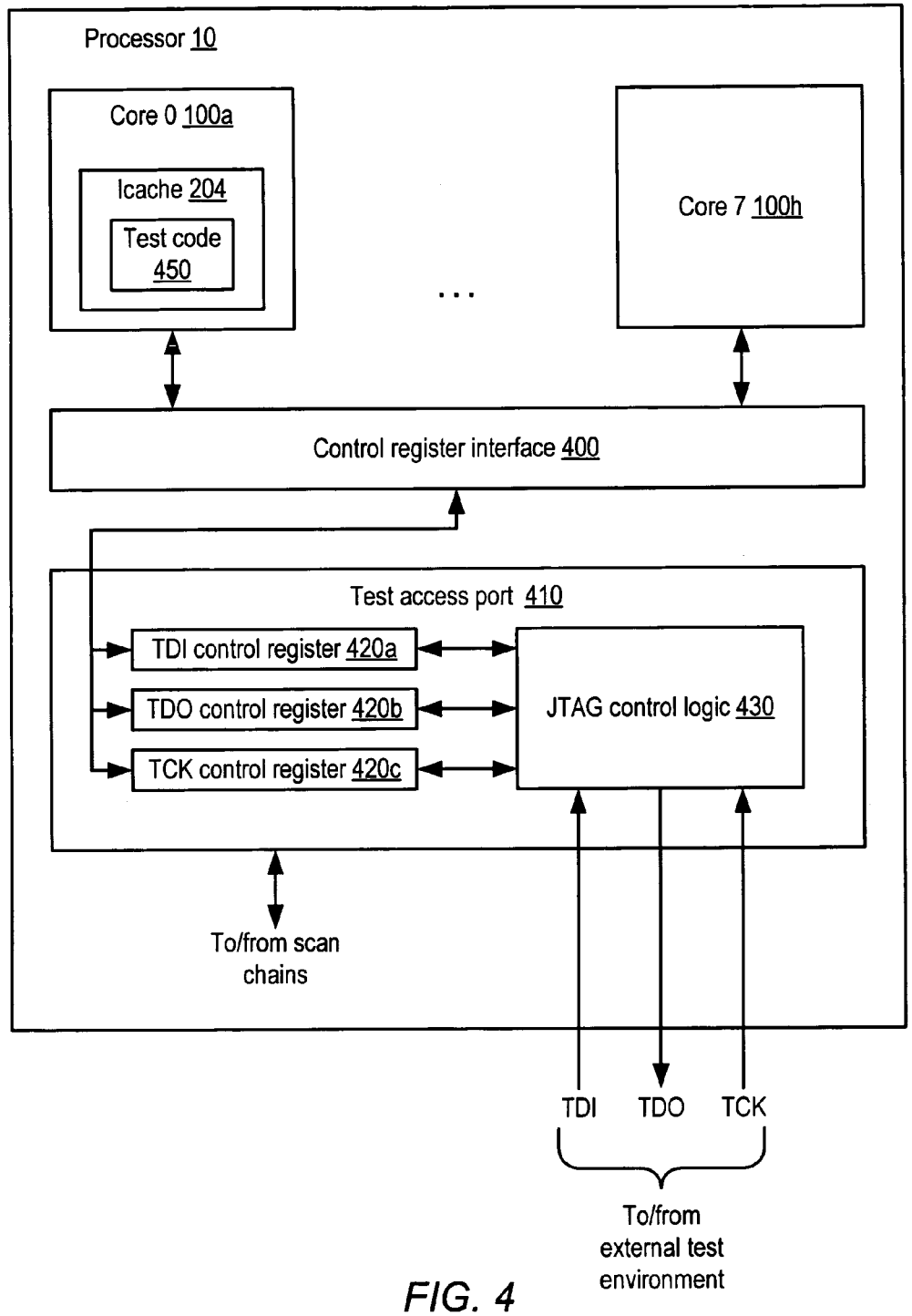
FIG. 4 is a block diagram of one embodiment of a processor including support for embedded test functionality.

In the embodiment illustrated in FIG. 4, processor 10 may be configured to allow internal resources to perform a substantial degree of IC testing independently of an external test environment including ATE devices. In the illustrated embodiment, a number of elements of processor 10 shown in FIG. 1 have been omitted for clarity, although it is understood that the embodiment shown in FIG. 4 may include those elements or other elements. In the illustrated embodiment, cores 100a-h are shown coupled to a control register interface 400. Processor 10 further includes a test access port 410 that includes a number of control registers 420a-c coupled to control register interface 400 as well as JTAG (Joint Test Action Group) control logic 430. JTAG control logic 430 may be coupled via various signals to a test environment external to processor 10 (e.g., to one or more ATE devices as described above), and test access port 410 may be coupled to a number of scan chains as described in greater detail below.

In one embodiment, test access port 410 may be compliant with a version of a standardized IC testing protocol such as the Institute of Electrical and Electronic Engineers IEEE-1149 standard, also referred to as the JTAG standard, although other suitable test interface protocols may be employed. Generally speaking, the JTAG standard describes a test protocol that provides for the serial input of data to an IC as a stimulus for testing as well as the serial output of data from an IC for verification of test results. Correspondingly, an IC device compliant with the JTAG standard may support at least three interface pins denoted Test Data In (TDI), Test Data Out (TDO) and Test Clock (TCK), although depending on the implementation, other test-related interface pins may also be supported.

Figure 5:
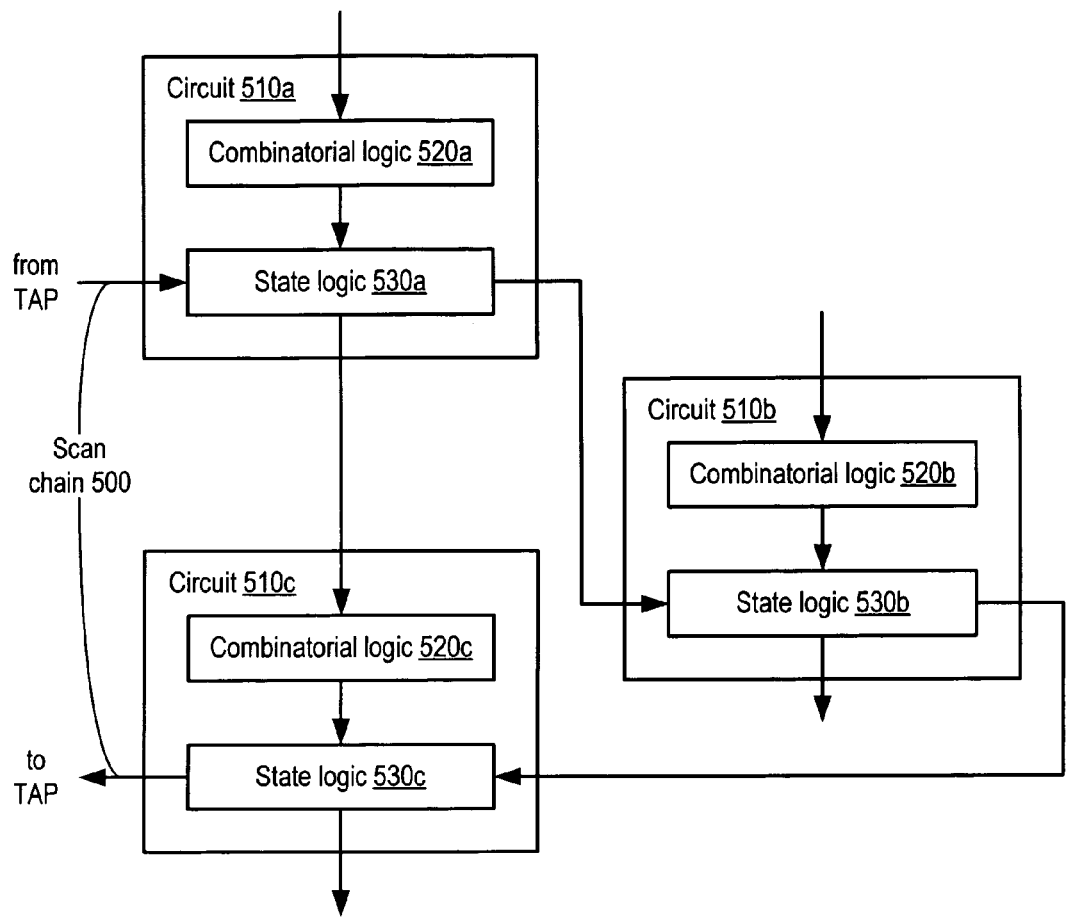
FIG. 5 is a block diagram illustrating one exemplary configuration of a scan chain.

Various circuits included within processor 10 may be accessible for testing via one or more scan chains that may be coupled to test access port 410 as shown in FIG. 4. One example configuration of a scan chain is illustrated in FIG. 5. In the illustrated embodiment, several distinct circuits 510a-c are shown. Each circuit 510 includes both combinatorial logic 520 and state logic 530. Generally speaking, combinatorial logic 520 may include logic gates or other structures that may not retain a logic output state once inputs to the combinatorial logic are removed or change in value. By contrast, state logic 530 may generally include registers, latches, flip-flops or other structures that may retain a logic output state even after input data is no longer present. It is noted that in some embodiments, circuits 510 may arrange combinatorial logic 520 and state logic 530 differently. For example, some circuits 510 may precede combinatorial elements with state elements, may use state elements both before and after combinatorial elements, or may implement multiple stages of alternating combinatorial and state elements. In other embodiments, such as certain dynamic logic families, all circuit elements may be considered state elements for the purpose of scanning as described below.

In the embodiment of FIG. 5, a scan chain 500 is shown interconnecting the state logic 530 of each of circuits 510. In some embodiments, scan chain 500 may be configured as a serial data path (e.g., a 1-bit wide data path), and each of state logic elements 530 may be configured as a shift register or an analogous element configured to shift its contents by, e.g., one bit position on each assertion of a scan clock, such as the JTAG TCK clock. It is noted that in some embodiments, scan chain 500 may be wider than a single bit but still partially serial in nature. For example, a four-bit wide scan chain 500 may transfer four bits of data per assertion of a scan clock, and state logic elements 530 may correspondingly shift by four bit positions per scan clock.

Scan chain 500, in some embodiments, may be manipulated under the control of test access port 410 and JTAG control logic 430 to serially load a particular data value into one or more of state logic elements 530, as well as to serially read a particular data value from one or more of those elements. For example, if the data storage widths of state logic 530a-c are 15 bits, 32 bits and 12 bits, respectively, a particular 32-bit data value may be loaded into state logic 530b by presenting the appropriate value in serial format to scan chain 500 and asserting the scan clock 47 times, resulting in the entire data value propagating through state logic 530a and into state logic 530b. Similarly, the value of state logic 530b may be read out by clocking scan chain 500 44 times and discarding the first 12 bits of data read (which correspond to data from state logic 530c). It is noted that in some embodiments, manipulation of a given scan chain 500 may occur without necessarily suspending the operation of circuits 510 included in the given scan chain 500. For example, state logic 530 may include a separate state element into which data may be inserted or captured for scanning. Such a separate element may be separately controlled from a state element used to interconnect two circuits 510. In such an embodiment, which may be referred to as a "shadow scan" technique, a value to be scanned may be captured into the separate state element and scanned without disrupting the data flow among circuits 510.

It is noted that in different embodiments, scan chains 500 may interconnect circuits 510 that otherwise may bear no functional relationship to one another. That is, circuits 510 belonging to different functional units of a core 100, different cores 100, or other disparate elements of processor 10 may be linked via a common scan chain 500. To the extent that state logic 530 is accessible via a scan chain 500 (that is, to the extent that state logic 530 is scannable), that logic may potentially be read or written by test access port 410. In some embodiments, every instance of state logic 530 within an IC may be scannable, whereas in other embodiments only certain instances of state logic 530 may be scannable. The use of multiple distinct scan chains 500 may help to manage the length of any given scan chain 500 (and correspondingly, the worst-case number of cycles required to read or write a state element on a given scan chain 500), to increase the overall number of state logic elements 530 that may be scanned, and/or to assist in developing a logical partitioning of scanned elements according to areas of IC functionality or geometry. In some embodiments, test access port 410 may manage an address space or other selection mechanism associated with scan chains 500 to allow a particular scan chain 500 to be selected for data input or output. For example, certain data patterns presented on TDI, TDO and/or TCK may be interpreted by test access port 410 as commands to select a particular scan chain 500 for manipulation. Alternatively, a separate interface to test access port 410 may be provided to perform scan chain selection.

In a conventional IC implementing the JTAG standard, a given scan chain 500 may be controlled through appropriate manipulation of JTAG interface pins, such as the TDI, TDO and TCK pins. However, in a conventional IC, scan chain input data is supplied by a test environment external to the IC, such as via an ATE device. Similarly, scan chain output data as well as an analysis of such output data is performed externally to the IC. For example, output data may be compared against expected data within the ATE device or a host system to determine whether a failure has occurred. However, exclusive reliance on an external test environment for control and analysis of scan chain input and output data may be subject to the limitations and cost concerns mentioned above.

By contrast, in the embodiment shown in FIG. 4, test access port 410 also includes virtualization logic configured to allow instructions executing on one or more of processor cores 100 to control the activity of test access port 410 for the testing of circuits. Specifically, in the illustrated embodiment, test access port 410 includes control registers 420a-c, each of which may read or written via control register interface 400 in response to instructions executing on a given processor core 100. Such instructions are shown in FIG. 4 as test code 450 resident within instruction cache 204 of core 100a. However, in other embodiments, test code 450 may reside within a cache of a different core 100 or multiple cores 100, within L2 cache 120, or within another data structure within processor 10. Test code 450 may also be loaded one or more instructions at a time from system memory via memory interface(s) 130, or via I/O interface 140. It is noted that in one embodiment, test code 450 as well as other instructions executable by cores 100 may be user-programmable. That is, the specific instructions that are executed by cores 100 may be specified by a user. Further, such instructions need not be fixed, as may be typical with embedded software, but rather may be dynamically and arbitrarily reconfigurable during the operation of processor 10. For example, different instructions may be executed by providing a different set of instructions to cores 100, such as by loading new code from a system memory coupled to processor 10.

In one embodiment, control registers 420 may be implemented as memory mapped control registers in which a given control register 420 corresponds to a given address in a memory address space that may also be referenced by cores 100 for general purpose memory load and store instructions. In one such embodiment, control register interface 400 may be configured to intercept load and store operations directed to an address corresponding to one of control registers 420. Control register interface 400 may then redirect such operations to read or write the appropriate control register 420. In another embodiment, control registers 420 may be implemented within an address space distinct from the address space associated with load and store operations. In such an embodiment, a core 100 may access a particular control register 420 using a memory load or store instruction that specifies the distinct control register address space instead of the memory address space, or may use a different type of instruction distinct from a memory load or store instruction. Any other suitable technique for accessing control registers 420 in response to instruction execution on one of cores 100 may be employed. It is contemplated that in some embodiments, any of cores 100 may be configured to access control registers 420, while in other embodiments control registers 420 may be accessible only to certain cores 100, for example on the basis of the privilege level of a core 100 or thread executing thereon, or other information.

As shown in FIG. 4, in one embodiment JTAG control logic 430 may be configured to receive TDI, TDO and TCK control inputs from control registers 420*a-c*, respectively. That is, in one embodiment, control registers 420 may be configured by test code 450 to control the TDI, TDO, and TCK pins of test access port 410 with respect to the functionality of JTAG control logic 430. For example, control registers 420 may be implemented as shift registers. In such an embodiment, test code 450 may be configured to load one or more of control registers 420 with a multiple-bit data value such as a data input value to be applied to the TDI pin or a series of test clock values to be applied to the TCK pin. For example, if control registers 420 are implemented as 32-bit registers, test code 450 may write up to 32 bits of data into control registers 420 in parallel. Subsequently, as control registers 420 are clocked, their data may be output in a serial fashion and presented to JTAG control logic 430 as TDI or TCK data. For example, the data stored within control register 420*a* may be serially input to a particular scan chain 500 according to the TCK pattern specified by control register 420*c*. Similarly, control register 420*b* may be serially loaded with data output from the particular scan chain 500 as TCK is clocked. Test code 450 may subsequently read control register 420*b* to analyze the scan chain output data. Support for internal control of a test interface that ordinarily interfaces externally to an IC, such as may be provided by control registers 420 and test code 450, may be referred to as embedded, localized or internally-driven testing.

In some embodiments, the aforementioned virtualization features (e.g., control registers 420 as well as modifications to JTAG control logic 430 to receive inputs from those registers) may enable test code 450 to have the same degree of control over the JTAG test interface as would an external test environment coupled to processor 10 via the JTAG pins. In such embodiments, test code 450 may be configured to perform any test of processor 10 that could be performed within the external test environment. However, since test code 450 may execute locally to processor 10, such tests may execute more quickly than if performed by an external test environment, as data bandwidth between cores 100 and test access port 410 may be substantially greater than data bandwidth between test access port 410 and the external test environment. Additionally, as described in greater detail below, in some embodiments test code 450 may be configured to implement more sophisticated test algorithms than may be performed by an external test environment.

Figure 6:
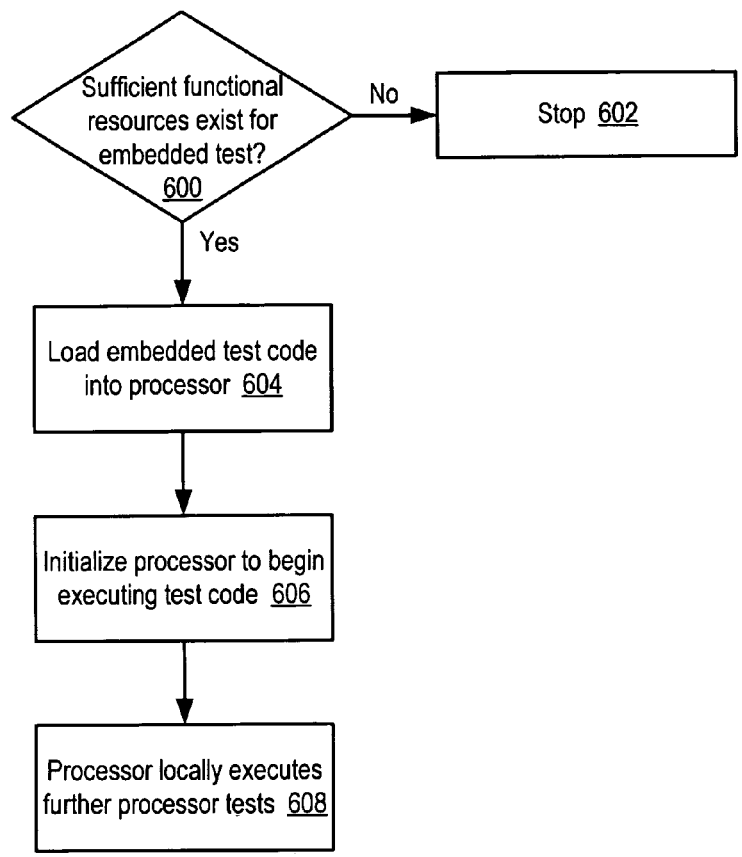
FIG. 6 is a flow diagram illustrating one embodiment of a method of testing a processor that includes support for embedded testing.

One embodiment of a method of testing a processor 10 that includes support for embedded testing is illustrated in FIG. 6. Referring collectively to FIGS. 1-6, operation begins in block 600 in which a test environment external to processor 10 determines whether sufficient functional resources exist within processor 10 to support embedded test operation. For example, a minimum requirement for embedded test of one embodiment of processor 10 may be that one core 100 is fully functional and can successfully communicate with test access port 410 via control register interface 400. In such an embodiment, an IC including processor 10 may be externally tested via its JTAG interface to ascertain whether at least one core 100 is functional and to determine the functionality of the path between cores 100 and test access port 410. It is noted that different embodiments of processor 10 may have different functional resource requirements for initiating embedded test. If processor 10 lacks these resources, embedded testing may not be possible, and the method may terminate (block 602). For example, processor 10 may be discarded as irredeemably flawed, or another form of test or analysis (e.g., probing, e-beaming, structural analysis, etc.) may be performed to diagnose the failure.

If sufficient functional processor resources do exist, instructions and data corresponding to test code 450 may be loaded into an appropriate data structure within processor 10 (block 604). For example, the external test environment may be configured to load an instruction cache 204 of a functional core 100 with bit patterns corresponding to the content of test code 450. As described above, in some embodiments test code 450 may be loaded into a data structure other than a cache internal to a particular core 100. It is noted that in some embodiments, test code 450 may be configured to autonomously generated certain test data patterns to be applied to scan chains 500. Consequently, it may be unnecessary to directly load such test data patterns from the external test environment into processor 10.

Processor 10 may then be initialized to begin executing test code 450 (block 606). For example, the external test environment may provide the appropriate reset or initialization stimulus via the JTAG interface or via the input/output (I/O) pins of processor 10 to cause the particular core 100 to begin executing test code 450. In some embodiments, the external test environment may additionally instruct JTAG control logic 430 to begin receiving test control information from control registers 420 rather than from the external test environment, for example by providing an appropriate command via the external JTAG interface, or by using a unique sequence of external JTAG pin sequencing. Alternatively, test code 450 may perform this redirection of JTAG control logic 430 itself, for example via another control register (not shown) configured to control features of test access port 410. In some embodiments, the external JTAG interface pins and/or control registers 420 may be time multiplexed, and in some embodiments, the external JTAG interface pins may be used when processor 10 is powered up (e.g., by default).

Test code 450 may then proceed to locally execute further tests of processor 10 (block 608). Test code 450 may be variously configured to perform numerous distinct types of tests. In one embodiment, test code 450 may be configured to perform functional testing of any circuit within processor 10 that is accessible via at least one scan chain 500. For example, referring once again to FIG. 5, test code 450 may be configured to determine whether combinatorial logic 520*c* is functioning properly by causing a particular data pattern to be scanned into state logic 530*a* (e.g., via manipulation of the TDI and TCK control registers 420*a* and 420*c* as described above), causing state logic 530*c* to capture the output of combinatorial logic 520*c*, and causing the captured output to be scanned out of state logic 530*c* (e.g., via manipulation of the TDO control register 420*b*). Test code 450 may then compare the captured output against the expected output to determine whether a failure occurred. In some embodiments, test code 450 may be configured to perform the majority of functional testing of processor 10, minimizing the degree of functional testing that is performed via an external test environment.

In another embodiment, test code 450 may be configured to perform transition or path delay testing to assess the performance of critical, frequency-limiting paths of processor 10. For example, it may be known from the design of processor 10 that certain circuits are likely candidates for limiting the overall clock frequency at which processor 10 may operate. In one embodiment, test code 450 may be configured to manipulate scan chains 500 associated with such critical circuits to ascertain the limits at which those circuits may reliably perform. For example, test code 450 may cause a particular data pattern to be loaded into a state element at the beginning of a critical path circuit, and may cause the circuit to be clocked and its output captured in a manner similar the functional test case described above. Such a test may be repeated with increasing clock rates to determine the point at which the critical path begins producing timing-related errors. Numerous other techniques and variations for performing scan-based transition testing are possible and contemplated.

Additionally, in one embodiment test code 450 may be configured to perform coverage analysis of instruction-level test sequences that may be executing on a given thread of a given core 100. In some embodiments, instruction-level testing may be performed in addition to scan testing to verify the functionality of a processor 10. However, it may be difficult to directly exercise certain functional areas of processor 10 (e.g., caches) using instruction-level testing. Test code 450 may be configured to monitor the state of a functional area of processor 10 after one or several instructions execute to determine the degree to which the circuits within the functional area have been exercised by the instructions. For example, test code 450 may directly examine certain state logic 530 associated with the functional area, or may monitor event counters or other logic that is configured to track activity of the functional area. Empirical data on coverage analysis of a given instruction-level test as collected by test code 450 may be used to gauge the effectiveness of the instruction-level test, for example to determine how many iterations of a random test should be performed to yield a given level of logic coverage, to determine an effective balance between scan and instruction-based test of a functional area, etc.

As noted previously, in some embodiments, test code 450 may have the same degree of control over the JTAG interface as an external test environment. For example, either test code 450 or an external test environment may be configured to control test access port 410 to perform scan testing, to access internal registers of processor 10 such as bus-based control register, to launch processor self-tests such as memory or logic self-tests, to read a processor identifier or revision register, to control behavior of processor 10 or cores 100 such as by stopping or single-stepping a processor clock signal, to debug processor events or access caches, or any of a number of other testing functions. Correspondingly, in some such embodiments, the source code for test code 450 may be reused in different test environments. For example, a given test may be written once in a high-level language, such as C or C++, and then used to generate test code 450 as well as patterns for use in a simulation environment or an ATE environment. Additionally, in one embodiment test code 450 may be configured to capture test patterns presented to processor 10 via the JTAG interface pins, for example to capture for reuse a test pattern that test code 450 is not configured to autonomously reproduce.

When test code 450 is executing on a core 100 while processor 10 is situated within an external test environment (e.g., coupled to an ATE device), communication of test status between processor 10 and the test environment may occur in a number of ways. In one embodiment, test code 450 may run autonomously and may store test result status within a data structure local to processor 10, such as a cache. If an error occurs, test code 450 may notify the external test environment, for example by causing assertion of a particular sequence or combination of those processor I/O pins monitored by the test environment. Alternatively, the external test environment may periodically poll the area within which test results are stored, for example via the processor's JTAG interface, to ascertain testing status.

Many of the tests implemented by test code 450 may be performed before processor 10 is deployed into a system, for example during the manufacturing process. However, in some embodiments, test code 450 may be configured to execute occasionally or continuously even after processor 10 has been deployed within a system. As noted above, in some embodiments processor 10 includes multiple cores 100 each of which may be configured to execute instructions from multiple threads. For example, in one embodiment processor 10 may include eight cores 100 each configured to execute eight threads, for a total of 64 distinct execution threads. In one such embodiment, test code 450 may be configured to execute on one of those threads while operating systems, applications and other software execute on the other threads. In such an embodiment, test code 450 may be configured to execute functional or other tests to determine the state of various circuits of processor 10 at various times. For example, in one embodiment, test code 450 may be stored in nonvolatile memory on a system board including processor 10 (for example, within system 800 shown in FIG. 8 and discussed below). When processor 10 is initialized, test code 450 may be activated to execute as a particular thread on a particular core 100 and may perform a suite of functional tests, such as power on self tests (POST), built-in self tests (BIST), or other initial checkout tests to determine the functional health of processor 10.

More generally, test code 450 may be configured to execute on one or several threads of one or more cores 100 in order to monitor and collect information regarding operational parameters of processor 10 while other software executes on other threads. For example, any of the aforementioned types of tests that may be performed by test code 450 while processor 10 is situated within an external test environment may also be performed by test code 450 when processor 10 is deployed within a system and is executing system software.

Execution of test code 450 during normal operation of processor 10 (which may be referred to as "mission mode"

operation) may assist in the monitoring and analysis of sensitive circuits of processor 10. In one embodiment processor 10 may include one or more high-speed serial interconnects configured to transfer data between cores 100 and peripheral logic included within processor 10, or between peripheral logic units. For example, in some embodiments serial interconnects may be employed between I/O interface 140 and peripheral interface 150 or network interface 160, between memory interface(s) 130 and individual system memory modules, or between cores 100 and crossbar 110. Such interconnects often provide for serialization of parallel data at an input to the interconnect as well as deserialization of transmitted data into parallel data at an output of the interconnect, and may correspondingly be referred to as serdes circuits.

Figure 7:
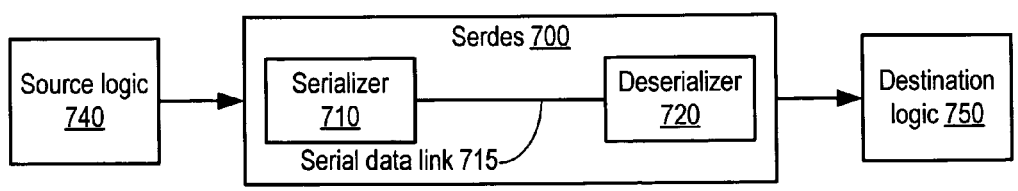
FIG. 7 is a block diagram illustrating one embodiment of a serializer/deserializer (serdes) circuit.

One embodiment of a serdes circuit is illustrated in FIG. 7. In the illustrated embodiment, serdes 700 includes a serializer 710 that may be configured to convert parallel data received from a source logic device 740 into serial data for transmission along a serial data link 715. Serdes 700 also includes a deserializer 720 that may be configured to convert serial data into parallel data for a destination logic device 750. Generally speaking, a serdes circuit may provide high-bandwidth data transfer in one or multiple channels over a minimum number of interconnect wires. Such transferred data may be encoded as symbols consisting of multiple bits using pulse amplitude modulation or other techniques. However, in some embodiments, interpretation of the a given symbol transmitted via serdes 700 may depend on a timing or framing signal embedded within the data itself, such that correct reception of the serial data may depend on accurate recovery of the embedded clock. Thus, serdes 700 may be sensitive to noise, timing jitter or other factors that may distort the serial data stream and possibly corrupt data, for example by impairing clock recovery. In some embodiments, serdes 700 may not allow for perfect, deterministic data transfer and may exhibit bit errors at a rate that may be influenced by environmental or operating conditions of processor 10. For example, noise, temperature changes, a fluctuation in operating voltage or other factors may influence the bit error rate of serdes 700. Redundancies within the symbol encoding or other error detection techniques, such as checksums, parity or other techniques may be employed to determine when a bit error occurs. Additionally, serdes 700 may support various tunable operating parameters that may be configured via control registers or via a scan chain 500. For example, serdes 700 may support adjustable parameters relating to the voltage offset and/or phase delay of the serial data stream at serializer 710, deserializer 720 or both. Serdes 700 may also support other parameters that may be adjusted to modify the operating behavior of the circuit. In various embodiments, serdes 700 may be implemented as a unidirectional channel, a bidirectional channel, or as multiple unidirectional channels in either or both directions of data transfer.

In some embodiments, test code 450 may be configured to conduct functional testing of serdes 700 via test access port 420, for example during manufacturing test or power-on self testing. However, in one embodiment, test code 450 may be configured to monitor the operating behavior of serdes 700 during operation of processor 10 and to adjust operating parameters of serdes 700 in response to the monitoring. For example, test code 450 may be configured to monitor serdes 700 to determine whether it is operating near a bit error condition (e.g., if a recovered clock signal exhibits insufficient timing margin relative to a data transition, such that uncertainty in the clock signal might alter the interpretation of received data). If so, test code 450 may notify system software executing on another thread, which may in turn adjust one or more operating parameters of serdes 700 to reduce the probability of a bit error occurring. Alternatively, test code 450 may perform this adjustment itself. Additionally, if a serdes bit error does occur, test code 450 may be configured to perform an analysis of recent transfers via serdes 700 to collect data regarding positioning of the recovered clock, as well as relationships among historical data voltage and timing transitions (e.g., eye diagram data) and other relevant operational characteristics of serdes 700. For example, in some embodiments, serdes 700 may be configured to store historical data associated with serdes activity prior to the detected error condition. Alternatively, test code 450 may be configured to regularly retrieve current state information from serdes 700 to construct such a history. Current and/or historical operating data may assist in identifying a root cause for the error behavior of serdes 700. Test code 450 may also be configured to gather similar data from other instances of serdes 700 to determine whether an issue is local or global in nature, whether the data exhibits trend behavior, etc. For example, a correlation between instances of serdes 700 that regularly exhibit a higher bit error rate than other instances may be indicative of a manufacturing quality or design issue. It is noted that techniques such as those just described are not limited to serdes circuits and may be employed with respect to any suitable circuit of processor 10.

Test code 450 may execute on a thread to detect or isolate errors in other circuits of processor 10 while other software executes on other threads. For example, test code 450 may be configured to cause a core 100 or a particular circuit or functional area of logic to be temporarily suspended, such as by stopping the clock to the logic. Such suspension may occur in response to test code 450 detecting a particular error phenomenon, such as a data pattern identified as a trigger condition occurring in a particular circuit. Alternatively, suspension may occur in response to logic asserting that an error has occurred (e.g., via a parity check signal or other error signal). Test code 450 may then cause relevant current and/or historical state information of the suspended logic to be scanned out and captured for further analysis. For example, the captured state may be stored as a test pattern that may be used as the basis for a test in a diagnostic environment. Such information capture may assist in the analysis of units of processor 10 that fail in deployment, for example transient failures that may occur due to complex interactions of applications, operating system software, and operating conditions such as frequency, temperature, voltage, etc. In some embodiments, it is contemplated that different instances of test code 450 may concurrently execute as distinct threads on one or more of cores 100 to perform different types of testing. For example, several threads of test code 450 may concurrently monitor respective instances of serdes circuits or other circuits.

It is noted that in some embodiments, processor 10 need not be a multiple-core, multiple-thread processor. In one embodiment, processor 10 may include only a single core 100 that may be coupled to a variety of interfaces and peripheral logic, such as I/O interface 140, peripheral interface 150, network interface 160, and/or one or more instances of serdes 700 as described above. In such an embodiment, the single processor core 100 may be validated via an external test environment to ascertain whether the core 100 includes sufficient resources to perform local testing of peripheral logic, in a manner similar to that described above. If so, test code 450 may be loaded into processor 10 and configured to perform testing of peripheral logic coupled to core 100. For example, test code 450 may be configured to perform any of the functional, performance, coverage or other types of tests described above on peripheral logic coupled to core 100, including testing and monitoring of serdes 700. Generally speaking, test code 450 may be configurable to test any peripheral logic external to a core 100 via test access port 420 to the extent that such peripheral logic could be tested via an external test environment.

Exemplary System Embodiment

Figure 8:
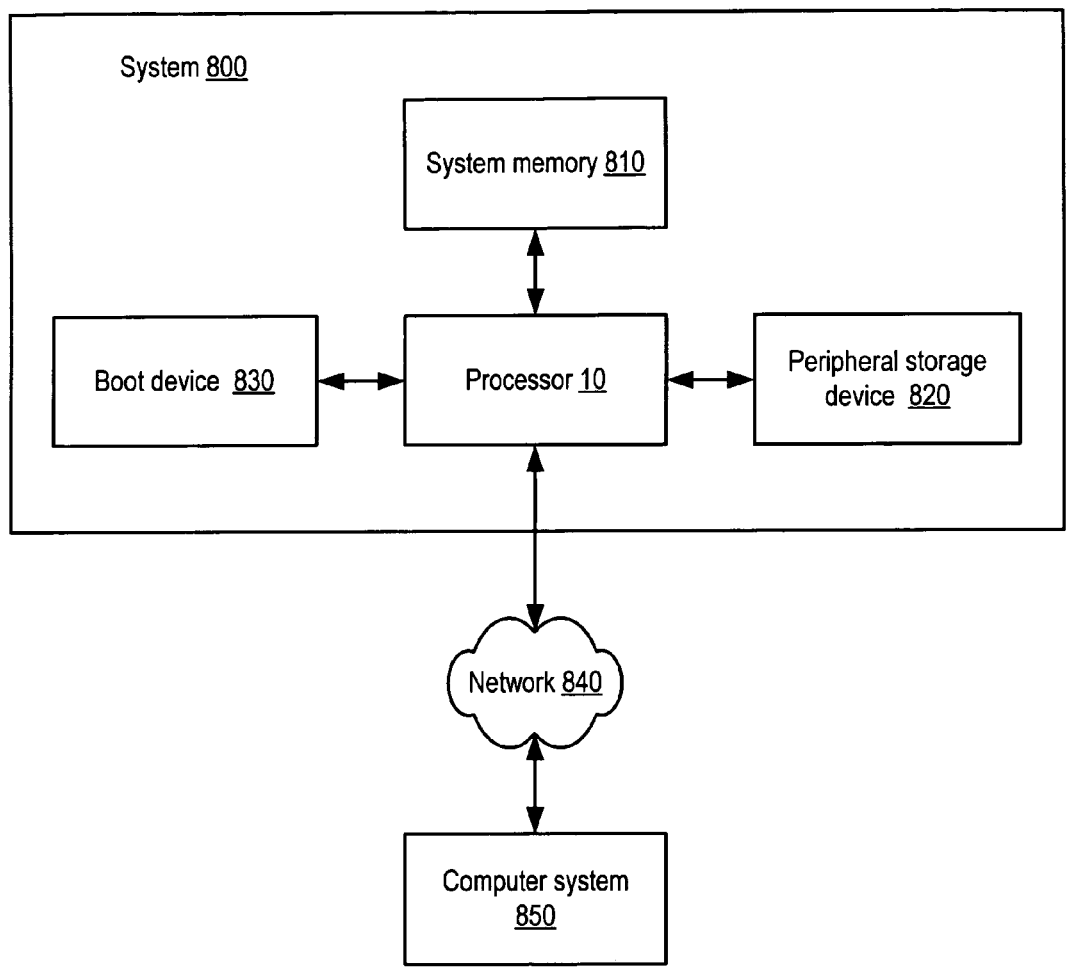
FIG. 8 is a block diagram illustrating one embodiment of a computer system.

As described above, in some embodiments processor 10 of FIG. 1 may be configured to interface with a number of external devices. One embodiment of a system including processor 10 is illustrated in FIG. 8. In the illustrated embodiment, system 800 includes an instance of processor 10 coupled to a system memory 810, a peripheral storage device 820 and a boot device 830. System 800 is coupled to a network 840, which is in turn coupled to another computer system 850. In some embodiments, system 800 may include more than one instance of the devices shown, such as more than one processor 10, for example. In various embodiments, system 800 may be configured as a rack-mountable server system, a standalone system, or in any other suitable form factor. In some embodiments, system 800 may be configured as a client system rather than a server system.

As noted previously, in various embodiments, system memory 810 may comprise any suitable type of system memory. Peripheral storage device 820 may be illustrative an I/O device that may be coupled to I/O interface 140 or peripheral interface 150 shown in FIG. 1, and in various embodiments may include support for magnetic, optical, or solid-state storage media such as hard drives, optical disks, nonvolatile RAM devices, etc. In some embodiments, peripheral storage device 820 may include more complex storage devices such as disk arrays or storage area networks (SANs), which may be coupled to processor 10 via a standard Small Computer System Interface (SCSI), a Fibre Channel interface, a Firewire® (IEEE 1394) interface, or another suitable interface. Additionally, it is contemplated that in other embodiments, any other suitable peripheral devices may be coupled to processor 10, such as multimedia devices, graphics/display devices, standard input/output devices, etc.

As described previously, in one embodiment boot device 830 may include a device such as an FPGA or ASIC configured to coordinate initialization and boot of processor 10, such as from a power-on reset state. Additionally, in some embodiments boot device 830 may include a secondary computer system configured to allow access to administrative functions such as debug or test modes of processor 10.

Network 840 may include any suitable devices, media and/or protocol for interconnecting computer systems, such as wired or wireless Ethernet, for example. In various embodiments, network 840 may include local area networks (LANs), wide area networks (WANs), telecommunication networks, or other suitable types of networks. In some embodiments, computer system 850 may be similar to or identical in configuration to illustrated system 800, whereas in other embodiments, computer system 850 may be substantially differently configured. For example, computer system 850 may be a server system, a processor-based client system, a stateless "thin" client system, a mobile device, etc.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit, comprising:
   a plurality of processor cores each configured to execute instructions; and
   a test access port configured to interface circuits included within the integrated circuit with a test environment external to the integrated circuit for testing of said circuits;
   wherein said test access port includes virtualization logic configured to allow a first set of instructions executing on a given one of said plurality of processor cores to control activity of said test access port for testing of said circuits.

2. The integrated circuit as recited in claim 1, wherein said circuits are accessible for testing via a plurality of scan chains, wherein said scan chains and said test access port are compliant with the Joint Test Access Group (JTAG) standard IEEE 1149.1-1990, and wherein said test access port includes a Test Data In (TDI) pin, a Test Data Out (TDO) pin, and a Test Clock (TCK) pin.

3. The integrated circuit as recited in claim 2, wherein said virtualization logic includes one or more control registers configured to control said TDI, TDO and TCK pins of said test access port in response to being programmed by instructions executing on said given processor core.

4. The integrated circuit as recited in claim 1, wherein said first set of instructions executing on said given processor core is configurable to perform functional testing via said test access port of any circuit included within said integrated circuit that is accessible via said test access port.

5. The integrated circuit as recited in claim 1, wherein said first set of instructions executing on said given processor core is configurable to perform transition testing via said test access port of any circuit included within said integrated circuit that is accessible via at least one scan chain.

6. The integrated circuit as recited in claim 1, further comprising a serializer/deserializer (serdes) circuit configured to directly or indirectly interface one or more of said processor cores with peripheral logic included within said integrated circuit, wherein said first set of instructions executing on said given processor core is configurable to monitor operating behavior of said serdes circuit and to adjust operating parameters of said serdes circuit in response to said monitoring.

7. The integrated circuit as recited in claim 1, further comprising a serializer/deserializer (serdes) circuit configured to directly or indirectly interface one or more of said processor cores with peripheral logic included within said integrated circuit, wherein said serdes circuit is accessible for testing via said test access port, and wherein said first set of instructions executing on said given processor core is configurable to perform functional testing of said serdes circuit via said test access port.

8. The integrated circuit as recited in claim 1, wherein instructions executed by each of said processor cores are user-programmable and wherein the instructions executed by said processor cores are dynamically configurable during operation of said processor cores.

9. The integrated circuit as recited in claim 1, wherein each of said processor cores is associated with a respective plurality of threads, and wherein each of said processor cores is configured to issue a first instruction from one of said respective plurality of threads during one execution cycle and to issue a second instruction from another one of said respective plurality of threads during a successive execution cycle.

10. The integrated circuit as recited in claim 9, wherein said first set of instructions is associated with a first one of said respective plurality of threads associated with a first one of said processor cores, wherein said first thread is configured to execute concurrently with other threads executing on said processor cores.

11. The integrated circuit as recited in claim 10, wherein one of said other threads includes instructions configured to implement one or more of an operating system or an application program.

12. The integrated circuit as recited in claim 10, wherein said first set of instructions associated with said first thread is configured to monitor operation of one or more of said circuits included within said integrated circuit while one or more of said other threads concurrently executes.

13. The integrated circuit as recited in claim 12, wherein in response to detecting an error condition associated with a monitored one of said circuits, said first set of instructions is configured to capture current state information associated with said monitored circuit for analysis.

14. The integrated circuit as recited in claim 12, wherein in response to detecting an error condition associated with a monitored one of said circuits, said first set of instructions is configured to capture historical state information associated with previous activity of said monitored circuit for analysis.

15. A method of testing an integrated circuit including a test access port configured to interface circuits included within the integrated circuit with a test environment external to the integrated circuit for testing of said circuits and a plurality of processor cores each independently programmable to execute instructions, the method comprising:

testing said integrated circuit via said test environment external to said integrated circuit to determine whether said integrated circuit includes sufficient functional resources to execute specific embedded testing instructions;

in response to determining that said integrated circuit includes sufficient functional resources to execute said specific embedded testing instructions, loading said specific embedded testing instructions into said integrated circuit from said external test environment via said test access port for execution by a given one of said processor cores; and said given processor core executing said specific embedded testing instructions independently of said external test environment;

wherein said test access port includes virtualization logic configured to allow said embedded testing instructions executing on said given processor core to control activity of said test access port for testing of said circuits.

16. The method as recited in claim 15, wherein said circuits are accessible for testing via a plurality of scan chains, wherein said scan chains and said test access port are compliant with the Joint Test Access Group (JTAG) standard IEEE 1149.1-1990, and wherein said test access port includes a Test Data In (TDI) pin, a Test Data Out (TDO) pin, and a Test Clock (TCK) pin.

17. The method as recited in claim 16, wherein said virtualization logic includes one or more control registers configured to control said TDI, TDO and TCK pins of said test access port in response to being programmed by said embedded testing instructions executing on said given processor core.

18. The method as recited in claim 15, wherein said embedded testing instructions executing on said given processor core are configurable to perform functional testing via said test access port of any circuit included within said integrated circuit that is accessible via said test access port.

19. The method as recited in claim 15, wherein said embedded testing instructions executing on said given processor core is configurable to perform transition testing via said test access port of any circuit included within said integrated circuit that is accessible via at least one scan chain.

20. A system, comprising:

a system memory; and a processor coupled to said system memory, wherein said processor includes:

a plurality of processor cores each configured to execute instructions; and a test access port configured to interface circuits included within the integrated circuit with a test environment external to the integrated circuit for testing of said circuits;

wherein said test access port includes virtualization logic configured to allow a first set of instructions executing on a given one of said plurality of processor cores to control activity of said test access port for testing of said circuits.

21. An integrated circuit, comprising:

a processor core configured to execute instructions;

peripheral logic coupled to said processor core; and a test access port configured to interface circuits included within the integrated circuit with a test environment external to the integrated circuit for testing of said circuits;

wherein said test access port includes virtualization logic configured to allow a first set of instructions executing on said processor core to control activity of said test access port for testing of said peripheral logic.

22. The integrated circuit as recited in claim 21, wherein said peripheral logic includes a serializer/deserializer (serdes) circuit configured to directly or indirectly interface said processor core with other logic included within said integrated circuit, wherein said serdes circuit is accessible for testing via said test access port, and wherein said first set of instructions is configurable to test said serdes circuit via said test access port.

* * * * *

UNITED STATES PATENT AND TRADEMARK OFFICE
CERTIFICATE OF CORRECTION

PATENT NO.        : 7,657,807 B1                                             Page 1 of 1
APPLICATION NO.   : 11/167248
DATED             : February 2, 2010
INVENTOR(S)       : Watkins et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 691 days.

Signed and Sealed this

Thirtieth Day of November, 2010

David J. Kappos
*Director of the United States Patent and Trademark Office*